US006399424B1

(12) United States Patent
Matsuura et al.

(10) Patent No.: US 6,399,424 B1
(45) Date of Patent: Jun. 4, 2002

(54) METHOD OF MANUFACTURING CONTACT STRUCTURE

(75) Inventors: Masazumi Matsuura; Kinya Goto; Noboru Morimoto, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 72 days.

(21) Appl. No.: 09/663,201

(22) Filed: Sep. 18, 2000

(30) Foreign Application Priority Data

Sep. 30, 1999 (JP) .......................................... 11-277922

(51) Int. Cl.[7] .................. H01L 21/44; H01L 21/8242; H01L 21/4763
(52) U.S. Cl. .................. 438/125; 438/241; 438/618; 438/636; 438/689; 438/786
(58) Field of Search ................... 438/125, 241, 438/618, 622, 636, 637, 623, 638, 640, 689, 786, 769, 788

(56) References Cited

U.S. PATENT DOCUMENTS

| 5,635,423 A | * | 6/1997 | Huang et al. | 438/638 |
| 6,110,648 A | * | 8/2000 | Jang | 430/312 |
| 6,187,663 B1 | * | 2/2001 | Yu et al. | 438/624 |
| 6,194,128 B1 | * | 2/2001 | Tao et al. | 438/637 |
| 6,235,653 B1 | * | 5/2001 | Chien et al. | 438/788 |
| 6,331,479 B1 | * | 12/2001 | Li et al. | 438/618 |

FOREIGN PATENT DOCUMENTS

| JP | 62-144342 | 6/1987 |
| JP | 11-87502 | 3/1999 |

* cited by examiner

Primary Examiner—Matthew Smith
Assistant Examiner—Igwe U. Anya
(74) Attorney, Agent, or Firm—Oblon, Spivak, McClelland, Maier & Neustadt, P.C.

(57) ABSTRACT

Implemented is a method of manufacturing a contact structure having a combination of formation of a buried wiring and that of a low dielectric constant interlayer insulating film in which a connecting hole to be formed in a low dielectric constant interlayer insulating film does not turn into an abnormal shape. A fourth interlayer insulating film 11 is formed on an upper surface of a third interlayer insulating film 10. Next, patterning for a wiring trench and a connecting hole is carried out into the fourth interlayer insulating film 11 and the third interlayer insulating film 10, respectively. Then, a pattern of the connecting hole is first formed in a third low dielectric constant interlayer insulating film 9. Thereafter, a second interlayer insulating film 8 exposed in the pattern is removed and a pattern of the wiring trench is formed in the third interlayer insulating film 10. Subsequently, second and third low dielectric constant interlayer insulating films 7 and 9 are etched, and the wiring trench and the connecting hole are formed at the same time. Thus, a photoresist can be formed again without the second and third low dielectric constant interlayer insulating films 7 and 9 exposed, and an abnormal shape is generated in the connecting hole with difficulty.

15 Claims, 10 Drawing Sheets

METHOD OF MANUFACTURING CONTACT STRUCTURE

BACKGROUND OF THE INVENTION

1. Field of the Invention

The present invention relates to a method of manufacturing a contact structure and more particularly to formation of a buried wiring and a low dielectric constant interlayer insulating film.

2. Description of the Background Art

In order to implement an increase in a speed in a semiconductor device having a small gate length (0.18 μm or less, for example), it is important that a signal delay in the device should be reduced. The signal delay in the device is represented by the sum of a signal delay in a transistor and a signal delay in a wiring. As a reduction in a wiring pitch is advanced rapidly, the signal delay in the wiring occupies a greater part of the signal delay in the device than the signal delay in the transistor.

The signal delay in the wiring is proportional to a product of a resistance of the wiring and a capacitance between the wirings. Therefore, it is necessary to decrease the resistance of the wiring or the capacitance between the wirings, thereby reducing the signal delay in the wiring. In order to solve this problem, there has vigorously been studied a combination of a buried wiring technique using a metal having a low resistance such as copper and a technique for forming an interlayer insulating film having a lower dielectric constant than that of a silicon oxide film to be a conventional typical interlayer insulating film. The present invention relates to a method of manufacturing a contact structure having a combination of a buried wiring forming method (a so-called Dual Damascene process) of forming a connecting hole for a lower layer wiring and an upper layer wiring at a time and formation of an organic low dielectric constant interlayer insulating film.

FIGS. 7 to 19 typically show each step of a conventional method of manufacturing a contact structure in which the formation of the buried wiring and that of the low dielectric constant interlayer insulating film are combined. FIGS. 14 to 17 are single view drawings for easily distinguishing a connecting hole from a wiring trench.

As shown in FIG. 7, first of all, an element such as a transistor is formed on a semiconductor substrate 1 such as a silicon substrate, and an insulating film is then formed to cover the element. In FIG. 7, the element and the insulating film are collectively represented as a lower insulating layer 2 and the element is not shown.

Next, a first low dielectric constant interlayer insulating film 3 is formed on the lower insulating layer 2, and a hard mask 4 is formed on the first low dielectric constant interlayer insulating film 3. A polyarylether (hereinafter referred to as PAE) film to be an organic substance comprising carbon, oxygen and hydrogen as main components, for example, is employed as the first low dielectric constant interlayer insulating film 3 and a silicon oxide film is employed as the hard mask 4, for example.

A photoresist 16 is formed on the hard mask 4 and a pattern 17a of the wiring trench is formed by using a photolithographic technique (FIG. 8). Then, the hard mask 4 is subjected to etching by using the photoresist 16 as a mask so that a pattern 17b of the wiring trench is formed in the hard mask 4 (FIG. 9). In the case in which the silicon oxide film is employed as the hard mask 4, etching is carried out through plasma etching using a mixed gas of $CF_4$ and $O_2$, for example.

After the etching for the hard mark 4 is completed, the first low dielectric constant interlayer insulating film 3 is subjected to the etching to form a wiring trench 17c. In the case in which the PAE film is employed as the first low dielectric constant interlayer insulating film 3, plasma etching using a mixed gas of $O_2$ and $N_2$ is carried out, for example. An etching gas has an etching effect for the photoresist. Therefore, the photoresist 16 can also be removed at the same time that the first low dielectric constant interlayer insulating film 3 is to be etched (FIG. 10). In this case, the hard mask 4 prevents the first low dielectric constant interlayer insulating film 3 in a portion other than an opening of the pattern 17b from being etched after the photoresist 16 is completely removed. For example, since the silicon oxide film is not removed by the plasma etching using the mixed gas of $O_2$ and $N_2$, it is suitable for the hard mask 4.

Then, a barrier metal (not shown) is formed over the whole surface of the semiconductor substrate 1 by using a sputtering method, for example, and a first metal film 5 such as copper is formed on the barrier metal by using the sputtering method, a chemical vapor deposition (hereinafter referred to as CVD) process, an electrolytic plating method or the like (FIG. 11), for example. The barrier metal is provided to prevent a metal constituting the first metal film 5 from being diffused into the lower insulating layer 2 and the first low dielectric constant interlayer insulating film 3.

Then, the barrier metal and the first metal film 5 which are provided above a surface of the hard mark 4 are removed by using a chemical mechanical polishing (which will be hereinafter referred to as CMP) process, for example. The barrier metal and the first metal film 5 are caused to remain only in the wiring trench (FIG. 12).

Next, a first interlayer insulating film 6, a second low dielectric constant interlayer insulating film 7, a second interlayer insulating film 8, a third low dielectric constant interlayer insulating film 9 and a third interlayer insulating film 10 are formed on the hard mask 4 and the first metal film 5 in this order (FIG. 13). For example, a silicon nitride film is employed as the first interlayer insulating film 6, a silicon oxide film is employed as the second and third interlayer insulating films 8 and 10, and a PAE film is employed as the second and third low dielectric constant interlayer insulating films 7 and 9.

Subsequently, a photoresist 18 is formed on the third interlayer insulating film 10 and a pattern 15e of a connecting hole is formed in the photoresist 18 by the photolithographic technique (FIG. 14). Then, the third interlayer insulating film 10, the third low dielectric constant interlayer insulating film 9, the second interlayer insulating film 8 and the second low dielectric constant interlayer insulating film 7 are subjected to etching by using the photoresist 18 as a mask so that a connecting hole 15f is formed (FIG. 15). In the case in which the silicon oxide film is employed as the second and third interlayer insulating films 8 and 10 and the PAE film is employed as the second and third low dielectric constant interlayer insulating films 7 and 9, it is preferable that the silicon oxide film should be subjected to the plasma etching using the mixed gas of $CF_4$ and $O_2$ and the PAE film should be subjected to the plasma etching using the mixed gas of $O_2$ and $N_2$. Moreover, the photoresist 18 is removed at the same time that the PAE film is etched. Furthermore, the first interlayer insulating film 6 functions as an etching stopper during the formation of the connecting hole 15f. Accordingly, the first metal film 5 is not etched.

Next, a wiring trench is formed in the third low dielectric constant interlayer insulating film 9. For this purpose, a photoresist 19 is formed on the third interlayer insulating film 10 and a pattern 13d of the wiring trench is formed by the photolithographic technique (FIG. 16). Then, the third interlayer insulating film 10 and the third low dielectric constant interlayer insulating film 9 are subjected to etching by using the photoresist 19 as a mask so that a pattern 13e of the wiring trench is formed. Subsequently, the first interlayer insulating film 6 is subjected to the etching so that a pattern 15g of the connecting hole is formed (FIG. 17). Then, a barrier metal (not shown) is formed over the whole surface of the semiconductor substrate 1 by using a sputtering method, for example, and a second metal film 20 is formed on the barrier metal (FIG. 18). Thereafter, the barrier metal and the second metal film 20 which are provided above a surface of the third interlayer insulating film 10 are removed by using the CMP method, for example, and the barrier metal and the second metal film 20 are caused to remain only in the wiring trench 13e and the connecting hole 15g (FIG. 19).

In the case in which a photomask to be used for the patterning of the photoresists 18 and 19 has a low alignment accuracy, a pattern cannot be formed in the photoresist as designed in some cases. In those cases, the photoresist is removed and is then reformed again. Thus, the photoresist is subjected to the patterning again. At this time, the incompletely formed photoresist can be removed through plasma ashing using an $O_2$ gas.

In the case in which the photoresist 18 is to be removed, it is sufficient that a new photoresist is formed and subjected to the patterning again. Therefore, there is no problem. However, a problem arises when the photoresist 19 is to be removed.

Since the connecting hole 15f has already been formed in the stage in which the photoresist 19 is to be removed, the second and third low dielectric constant interlayer insulating films 7 and 9 are exposed to the connecting hole 15f. Consequently, wall surfaces of the second and third low dielectric constant interlayer insulating films 7 and 9 which are exposed to the connecting hole 15f are exposed to an $O_2$ gas plasma for removing the photoresist 19. The PAE film or the like included in the low dielectric constant interlayer insulating films has such a property that it is etched through exposure to the $O_2$ gas plasma. Accordingly, in the case in which a material to be easily etched by the $O_2$ gas plasma, for example, the PAE film is employed as the second and third low dielectric constant interlayer insulating films 7 and 9, a wall surface 21 exposed to the connecting hole 15f of the second and third low dielectric constant interlayer insulating films 7 and 9 is excessively etched as shown in FIG. 20 so that it retreats to a wall surface 22 in a position which is more recessed. In other words, a diameter of the connecting hole 15f is increased, resulting in an abnormal shape. Thus, such a dimension as to be designed cannot be obtained.

Consequently, the metal film cannot fully be buried in the connecting hole 15f so that a contact of the lower layer wiring with the first metal film 5 cannot be obtained sufficiently or a short-circuit is caused due to the adjacent connecting holes coupled to each other.

Moreover, also in the case in which the photomask has a high alignment accuracy and patterns are formed in the photoresists 18 and 19 as designed, the diameter of the connecting hole 15f is similarly increased easily in the stage of forming the wiring trench 13e after the state shown in FIG. 16. In order to form the wiring trench 13e, it is necessary to carry out the patterning into the third interlayer insulating film 10 and the third low dielectric constant interlayer insulating film 9. However, the connecting hole 15f has already been formed when the patterning is to be carried out. Therefore, the wall surface of the second low dielectric constant interlayer insulating film 7 which is exposed into the connecting hole 15f is easily subjected to excessive etching. More specifically, the wall surface 21 of the second low dielectric constant interlayer insulating film 7 which is exposed into the connecting hole 15f retreats to the wall surface 22 which is more recessed as shown in FIG. 21. In the same manner as the above-mentioned case, the diameter of the connecting hole 15f is increased, resulting in an abnormal shape. As a result, there is a problem in that the metal film cannot fully be buried in the connecting hole 15f or the adjacent connecting holes are short-circuited as described above.

Furthermore, the above-mentioned excessive etching for the low dielectric constant interlayer insulating film is accelerated because the surface of the third interlayer insulating film 10 is exposed during the etching of the low dielectric constant interlayer insulating film. When the photoresist 18 is completely removed from the step shown in FIG. 14 to the step shown in FIG. 15, the third interlayer insulating film 10 acts as a mask for the subsequent etching plasma. If the silicon oxide film is employed as the third interlayer insulating film 10, oxygen atoms are turned out from the surface of the silicon oxide film by the etching plasma. As a result, it is supposed that an etching plasma rich in oxygen can be generated.

SUMMARY OF THE INVENTION

In order to solve the above-mentioned problem, it is an object of the present invention to implement a method of manufacturing a contact structure having a combination of formation of a buried wiring and that of a low dielectric constant interlayer insulating film in which a connecting hole formed in the low dielectric constant interlayer insulating film does not turn into an abnormal shape.

A first aspect of the present invention is directed to a method of manufacturing a contact structure comprising the steps of (a) preparing a substrate layer having an electrode to be connected in a surface, (b) forming a first insulating film, a second insulating film, a third insulating film, a fourth insulating film having a higher tolerance to a photoresist removing processing than the third insulating film, and a fifth insulating film having a first through hole on the substrate layer in this order, (c) forming the photoresist on the fourth and fifth insulating films, patterning the photoresist, etching the fourth insulating film by using the photoresist as a mask, thereby forming, in the fourth insulating film, a second through hole partially exposed to the first through hole, (d) etching the third insulating film by using the fourth insulating film as a mask, thereby forming, in the third insulating film, a third through hole having the same shape as that of the second through hole, (e) etching the fourth insulating film by using the fifth insulating film as a mask, thereby forming a fourth through hole having the same shape as that of the first through hole, (f) etching the second insulating film by using the third insulating film as a mask, thereby forming a fifth through hole having the same shape as that of the second through hole, and (g) etching the third insulating film and the first insulating film by using the fourth insulating film and the second insulating film as masks, thereby forming sixth and seventh through holes having the same shapes as those of the first through hole and the second through hole to be positioned above the electrode, respectively.

A second aspect of the present invention is directed to the method of manufacturing a contact structure according to the first aspect of the present invention, wherein the sixth through hole and the seventh through hole are simultaneously formed at the step (g).

A third aspect of the present invention is directed to the method of manufacturing a contact structure according to the first or second aspect of the present invention, wherein the steps (e) and (f) are carried out at the same time.

A fourth aspect of the present invention is directed to the method of manufacturing a contact structure according to any of the first to third aspects of the present invention, further comprising the step (h) of removing the fifth insulating film after the step (g).

A fifth aspect of the present invention is directed to the method of manufacturing a contact structure according to any of the first to fourth aspects of the present invention, further comprising the step (i) of forming a sixth insulating film having etching selectivity to the first insulating film on the substrate layer before the step (b), and the step (j) of etching the sixth insulating film by using the first insulating film as a mask, thereby forming an eighth through hole having the same shape as that of the second through hole.

A sixth aspect of the present invention is directed to the method of manufacturing a contact structure according to the fifth aspect of the present invention, further comprising the step (h) and the step (j) are carried out at the same time.

A seventh aspect of the present invention is directed to the method of manufacturing a contact structure according to any of the first to sixth aspects of the present invention, wherein the fifth insulating film is a silicon nitride film, a silicon carbide film or a silicon carbide oxide film.

An eighth aspect of the present invention is directed to the method of manufacturing a contact structure according to any of the first to seventh aspects of the present invention, wherein the first or third insulating film is a polyarylether film, and the third, sixth or seventh through hole is formed on the first or third insulating film by plasma etching using a mixed gas of nitrogen, hydrogen and ammonia at the step (d) or (g).

According to the first aspect of the present invention, it is possible to form a contact structure in which the sixth through hole is provided in the upper side and the seventh through hole is provided in the lower side. Moreover, even if the photoresist removing processing is carried out for re-patterning during the formation of the second through hole, the third insulating film is not affected because of the existence of the fourth insulating film having a high tolerance to the photoresist removing processing.

According to the second aspect of the present invention, the formation of the sixth through hole in the third insulating film and that of the seventh through hole in the first insulating film are carried out at the same time. Therefore, it is possible to prevent the seventh through hole from being excessively etched by adjusting the materials, thicknesses and etching rates of the first and third insulating films. Accordingly, the abnormal shape of the seventh through hole is generated with difficulty.

According to the third aspect of the present invention, a short time is required for the step.

According to the fourth aspect of the present invention, the fifth insulating film is finally removed. Therefore, it is possible to use a material having a high dielectric constant for the fifth insulating film.

According to the fifth aspect of the present invention, the sixth insulating film functions as an etching stopper when the first insulating film is to be etched. Therefore, the electrode to be connected is not etched.

According to the sixth aspect of the present invention, a short time is required for the step.

According to the seventh aspect of the present invention, it is possible to suppress the acceleration of the etching of the first or third insulating film.

According to the eighth aspect of the present invention, the etching speed of the first or third insulating film is increased.

These and other objects, features, aspects and advantages of the present invention will become more apparent from the following detailed description of the present invention when taken in conjunction with the accompanying drawings.

DESCRIPTION OF THE PREFERRED EMBODIMENT

Embodiment

Figure 1:
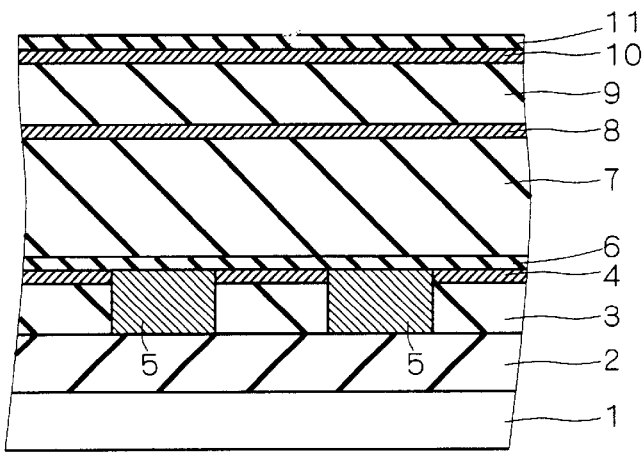
FIGS. 1 to 6 are sectional views showing the steps of a method of manufacturing a contact structure according to an embodiment of the present invention.

First of all, the steps shown in FIGS. 7 to 13 are carried out in the same manner as the conventional art. Consequently, a lower insulating layer 2, a first low dielectric constant interlayer insulating film 3, a hard mask 4, a barrier metal (not shown), a first metal film 5, a first interlayer insulating film 6, a second low dielectric constant interlayer insulating film 7, a second interlayer insulating film 8, a third low dielectric constant interlayer insulating film 9 and a third interlayer insulating film 10 are formed on a semiconductor substrate 1.

It is preferable that the same material as that in the conventional art should be used for each layer. More specifically, it is preferable that a PAE film should be employed as the first to third low dielectric constant interlayer insulating films 3, 7 and 9, for example. The PAE film can be formed by a spin coating method, for example. In addition, it is possible to apply, to the low dielectric constant interlayer insulating film, a material formed by a spin coating method, for example, hydrogen silsesquioxane, methyl silsesquioxane, benzocyclobutene, polytetrafluoroethylene, xerogel to be porous silica, aerogel to be porous silica or the like and a material formed by a CVD method, for example, a fluorinated silicon oxide film, fluorinated amorphous carbon, parylene or the like. These low dielectric constant interlayer insulating films have dielectric constants of approximately 1.8 to 3.0. The first low dielectric constant interlayer insulating film 3 has a thickness of 400 nm, for example, the second low dielectric constant interlayer insulating film 7 has a thickness of 600 nm, for example, and the third low dielectric constant interlayer insulating film 9 has a thickness of 400 nm, for example.

Moreover, it is preferable that a silicon oxide film should be employed as the hard mask 4, the second interlayer insulating film 8 and the third interlayer insulating film 10 in the same manner as the conventional art, for example. Furthermore, the third interlayer insulating film 10 should have a tolerance to a photoresist removing processing. The silicon oxide film has the tolerance. The silicon oxide film can be formed by a plasma CVD method, for example. It is preferable that the hard mask 4, the second interlayer insulating film 8 and the third interlayer insulating film 10 should have a thickness of 100 nm, for example, respectively.

Moreover, it is preferable that a silicon nitride film should be employed as the first interlayer insulating film 6 in the same manner as the conventional art, for example. The silicon nitride film can also be formed by the plasma CVD method, for example. It is preferable that the first interlayer insulating film 6 should have a thickness of 100 nm, for example.

Furthermore, an aluminum alloy, copper or the like may be used for the first metal film 5, for example. These metal films can be formed by using a CVD method, an electrolytic plating method or a reflow method in which a sputtered metal film is softened and buried through a heat treatment, or the like.

Next, a fourth interlayer insulating film 11 is formed on the third interlayer insulating film 10 (FIG. 1). It is preferable that the silicon nitride film should be employed as the fourth interlayer insulating film 11, for example. Moreover, the fourth interlayer insulating film 11 should have a tolerance to the photoresist removing processing. The silicon nitride film has the tolerance. The silicon nitride film can be formed by the plasma CVD method, for example, in the same manner as the first interlayer insulating film 6. Furthermore, it is preferable that the fourth interlayer insulating film 11 should have a thickness of 100 nm, for example.

Figure 2:
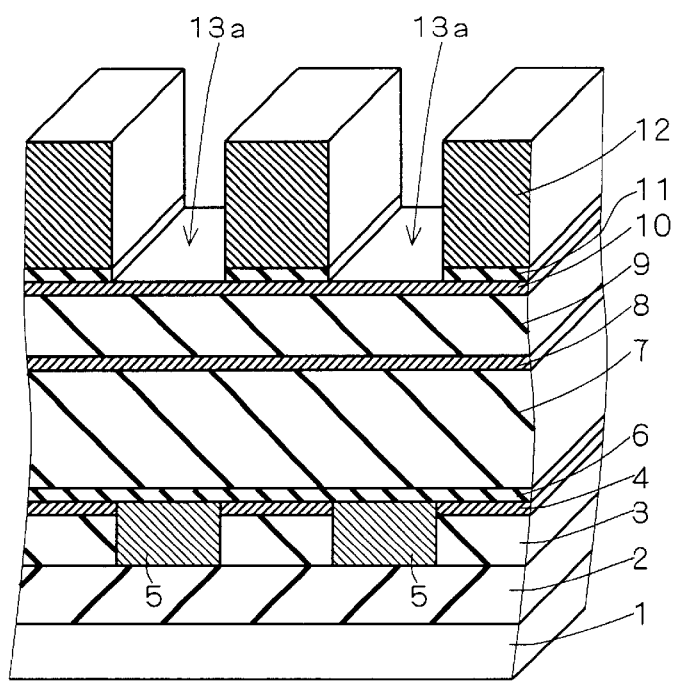

Subsequently, patterning for a wiring trench is carried out into the fourth interlayer insulating film 11. First of all, a photoresist 12 is formed on the fourth interlayer insulating film 11, a pattern of the wiring trench is formed in the photoresist 12, and etching is carried out by using the photoresist 12 as a mask and the third interlayer insulating film 10 as an etching stopper. A pattern 13a of the wiring trench is formed in the fourth interlayer insulating film 11 (FIG. 2). In the case in which the silicon oxide film is employed as the third interlayer insulating film 10 and the silicon nitride film is employed as the fourth interlayer insulating film 11, the third interlayer insulating film 10 is rarely etched and the pattern 13a can be formed in the fourth interlayer insulating film 11 through the plasma etching using a mixed gas of $Cl_2$ and $O_2$, for example. In the plasma etching using the mixed gas of $Cl_2$ and $O_2$, it is possible to set the ratio of an etching rate (a thickness of a film which can be removed per unit time) to the silicon nitride film-:silicon oxide film=approximately 10:1, for example, by adjusting the etching conditions such as a gas flow ratio.

Figure 3:
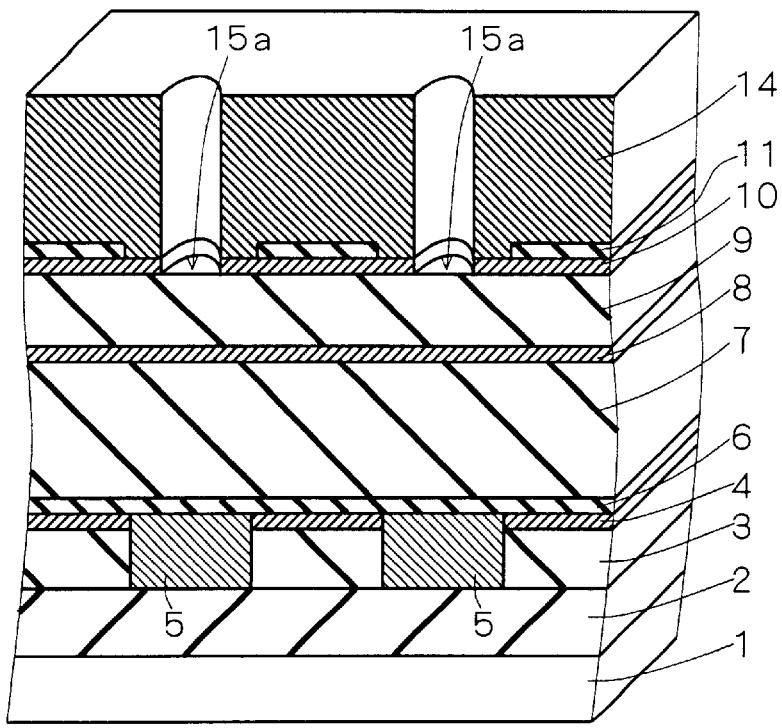

Then, the photoresist 12 is removed and patterning for the connecting hole is then carried out into the third interlayer insulating film 10. A photoresist 14 is formed on the third interlayer insulating film 10 and the fourth interlayer insulating film 11 and a pattern of the connecting hole is formed in the photoresist 14 to be kept in the formed pattern 13a. Etching is carried out by using the pattern as a mask and the third low dielectric constant interlayer insulating film 9 as an etching stopper. Then, a pattern 15a of a connecting hole is formed in the third interlayer insulating film 10 (FIG. 3).

In the case in which the alignment accuracy of the photomask is not high during the formation of the pattern 15a, the photoresist is removed, and is then formed again and is subjected to patterning. At this time, even if the photoresist removing processing is carried out for the re-patterning, the third low dielectric constant interlayer insulating film 9 is not affected because of the existence of the third interlayer insulating film 10 having a high tolerance to the photoresist removing processing.

In the case in which the silicon oxide film is employed as the third interlayer insulating film 10 and the PAE film is employed as the third low dielectric constant interlayer insulating film 9, the pattern 15a can be formed in the third interlayer insulating film 10 without etching the third low dielectric constant interlayer insulating film 9 at all if plasma etching using a mixed gas of $C_4F_8$ and Ar, for example, is carried out. The reason is that the PAE film is not removed by the plasma etching using the mixed gas of $C_4F_8$ and Ar.

A very small amount of $O_2$ gases may further be added to the mixed gas of $C_4F_8$ and Ar. Consequently, a redeposited substance generated by the etching is easily removed. Therefore, an aspect ratio of the pattern 15a is raised so that a more desirable etching shape is obtained and an etching residue remains with difficulty. In this step a very small amount of $O_2$ gases are used. Therefore, even if a material which is easily etched by the $O_2$ gas plasma, for example, the PAE film is employed as the third low dielectric constant interlayer insulating film 9, the third low dielectric constant interlayer insulating film 9 is less damaged.

At the step of forming the pattern 15a of the connecting hole, if the photomask has a low alignment accuracy, the pattern of the connecting hole is not kept in the region of the pattern 13a of the wiring trench during the patterning of the photoresist 14 and the fourth interlayer insulating film 11 is exposed to the pattern formed in the photoresist 14. However, it is sufficient that the first metal film 5 to be a lower layer wiring and an upper layer wiring trench can be conducted through the connecting hole. In such a case, therefore, the connecting hole may be formed without reforming if impediment, for example, a short circuit to other portions is not caused. In that case, it is preferable that both the third interlayer insulating film 10 and the fourth interlayer insulating film 11 which are exposed to the pattern formed in the photoresist 14 should be etched.

Figure 4:
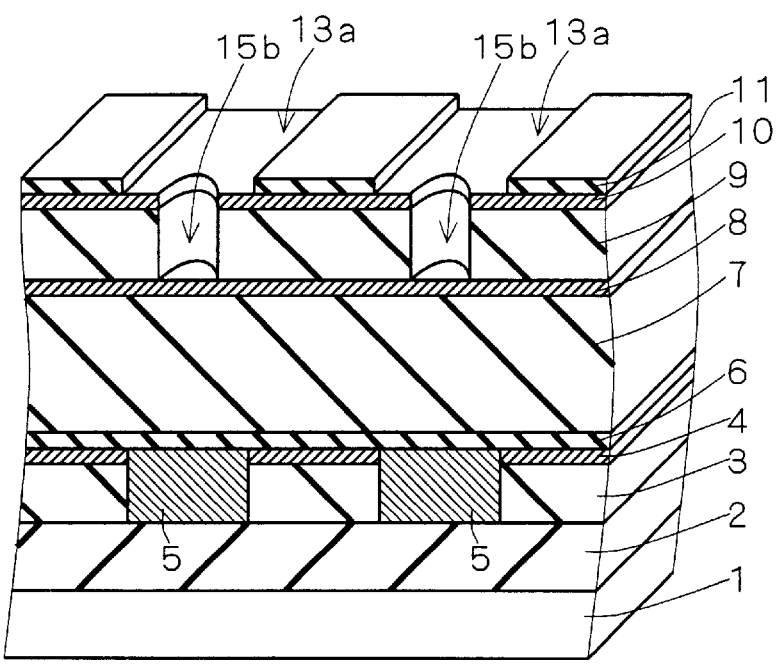

Next, the patterning of the connecting hole is carried out into the third low dielectric constant interlayer insulating film 9 (FIG. 4). At this time, the third low dielectric constant interlayer insulating film 9 is subjected to etching by using the photoresist 14, the third interlayer insulating film 10 and the fourth interlayer insulating film 11 as masks and the second interlayer insulating film 8 as an etching stopper. The photoresist 14 is subjected to the etching simultaneously with the etching of the third low dielectric constant interlayer insulating film 9. Accordingly, after the photoresist 14 is removed, the third interlayer insulating film 10 and the fourth interlayer insulating film 11 function as masks. In the case in which the silicon oxide film is employed as the second and third interlayer insulating films 8 and 10, the silicon nitride film is employed as the fourth interlayer insulating film 11 and the PAE film is employed as the third low dielectric constant interlayer insulating film 9, it is preferable that plasma etching using a mixed gas of $O_2$ and $N_2$ or a mixed gas of $N_2$ and $H_2$, for example, should be carried out. In the case of any of the mixed gases, a pattern 15b having the same shape as that of the pattern 15a can be formed on the third low dielectric constant interlayer insulating film 9 without etching the second and third interlayer insulating films 8 and 10 and the fourth interlayer insulating film 11. The reason is that the silicon oxide film and the silicon nitride film are not removed by the plasma etching using any of the mixed gases. Accordingly, the etching is stopped when the second interlayer insulating film 8 is exposed to the pattern 15b.

In the case in which the mixed gas of $N_2$ and $H_2$ is used, an $NH_3$ gas may further be added. Consequently, the etching speed of the third low dielectric constant interlayer insulating film 9 is increased.

Next, the third interlayer insulating film 10 is subjected to the etching by using the fourth interlayer insulating film 11 as a mask and the third low dielectric constant interlayer insulating film 9 as an etching stopper, and a pattern 13b having the same shape as that of the pattern 13a is formed in a portion of the third interlayer insulating film 10 which is exposed to the pattern 13a of the wiring trench.

Figure 5:
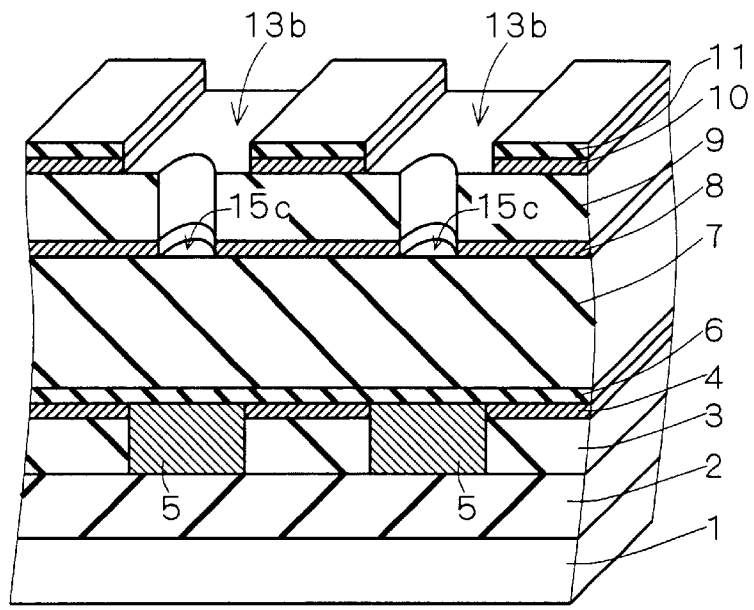

Then, the second interlayer insulating film 8 is subjected to the etching by using the third low dielectric constant interlayer insulating film 9 as a mask and the second low dielectric constant interlayer insulating film 7 as an etching stopper, and a pattern 15c having the same shape as that of the pattern 15b is formed also in a portion of the second interlayer insulating film 8 which is exposed to the pattern 15b of the connecting hole (FIG. 5). In the case in which the silicon oxide film is employed as the second and third interlayer insulating films 8 and 10, the silicon nitride film is employed as the fourth interlayer insulating film 11 and the PAE film is employed as the second and third low dielectric constant interlayer insulating films 7 and 9, it is preferable that plasma etching using a mixed gas of $C_4F_8$ and Ar should be carried out in the same manner as the step of forming the pattern 15a of the connecting hole, for example. Consequently, the pattern 13b of the wiring trench can be formed in the third interlayer insulating film 10 and a pattern 15c of the connecting hole can be formed in the second interlayer insulating film 8 without etching the second and third low dielectric constant interlayer insulating films 7 and 9 and the fourth interlayer insulating film 11. The reason is as follows. The PAE film is not removed by the plasma etching using the mixed gas of $C_4F_8$ and Ar as described above. Referring to the silicon nitride film, the ratio of an etching rate can be set to the silicon oxide film: the silicon nitride film=approximately 10:1, for example, by the adjustment of the etching conditions. In the same manner as the foregoing, a very small amount of $O_2$ gases may be added to the mixed gas of $C_4F_8$ and Ar. By the addition of the $O_2$ gas, a more desirable etching shape can be obtained and an etching residue remains with difficulty as described above. The $O_2$ gas is used in a very small amount. Therefore, also in the case in which a material to be easily etched with an $O_2$ gas plasma, for example, a PAE film is employed as the second and third low dielectric constant interlayer insulating films 7 and 9, the second and third low dielectric constant interlayer insulating films 7 and 9 are less damaged.

If materials having no etching selectivity each other (the same material such as the silicon oxide film in the abovementioned example) are employed as the second interlayer insulating film 8 and the third interlayer insulating film 10, the pattern 15c and the pattern 13b can be formed at the same time through one—time etching. Thus, a short time is required from the step of FIG. 4 to that of FIG. 5. Of course, the materials having etching selectivity each other may be used for the second and third interlayer insulating films 8 and 10 to individually carry out the etching.

Figure 6:
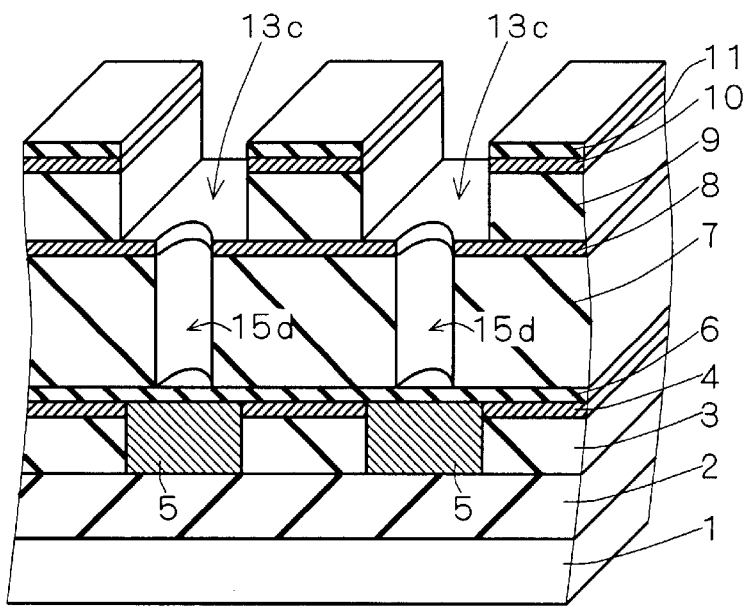
Figure 7:
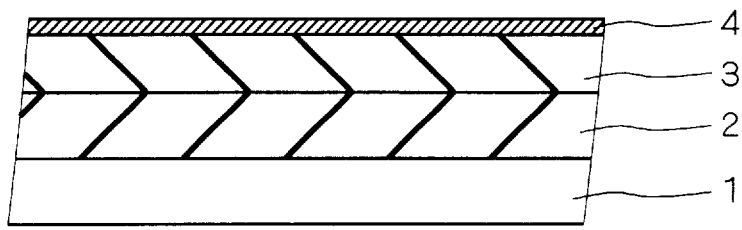
FIGS. 7 to 19 are sectional views showing the steps of a conventional method of manufacturing a contact structure.
Figure 8:
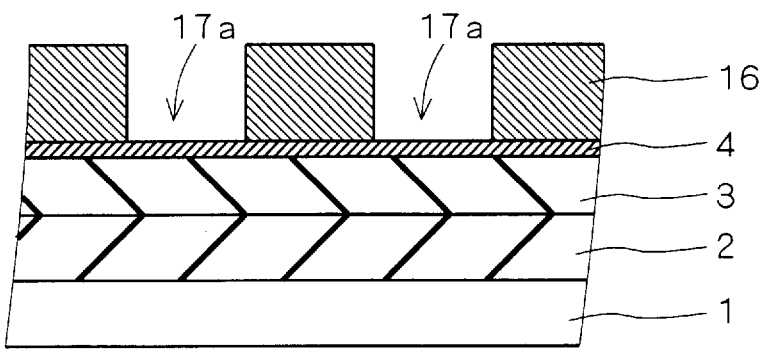
Figure 9:
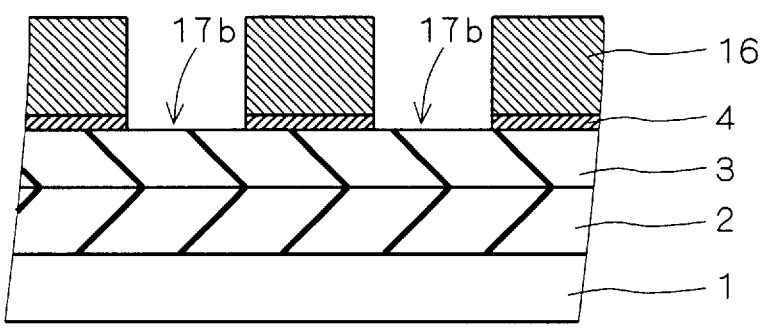
Figure 10:
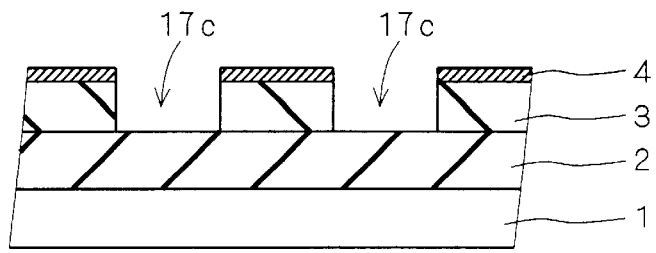
Figure 11:
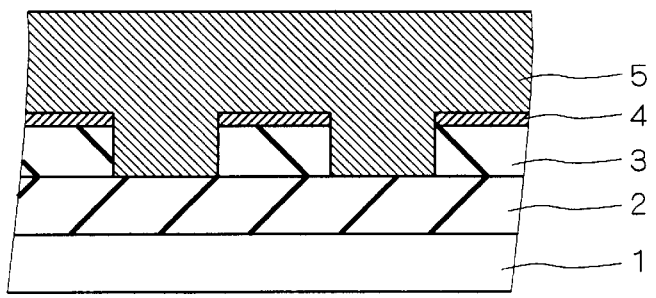
Figure 12:
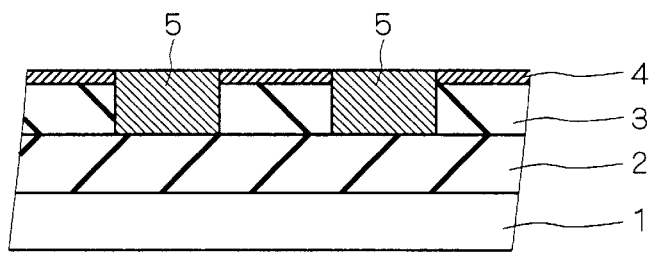
Figure 13:
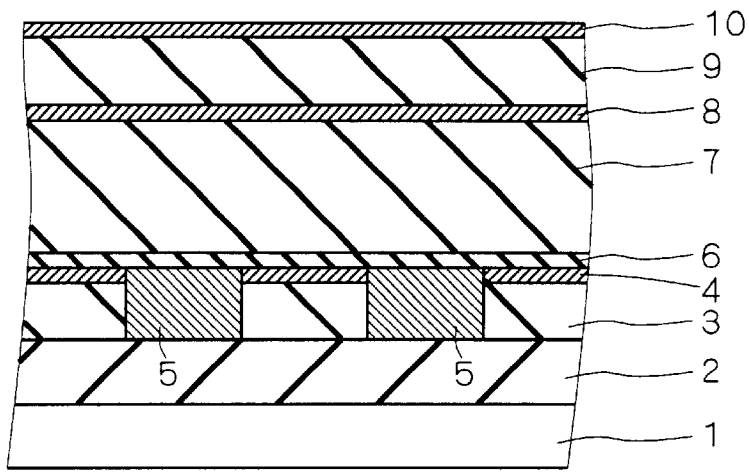
Figure 14:
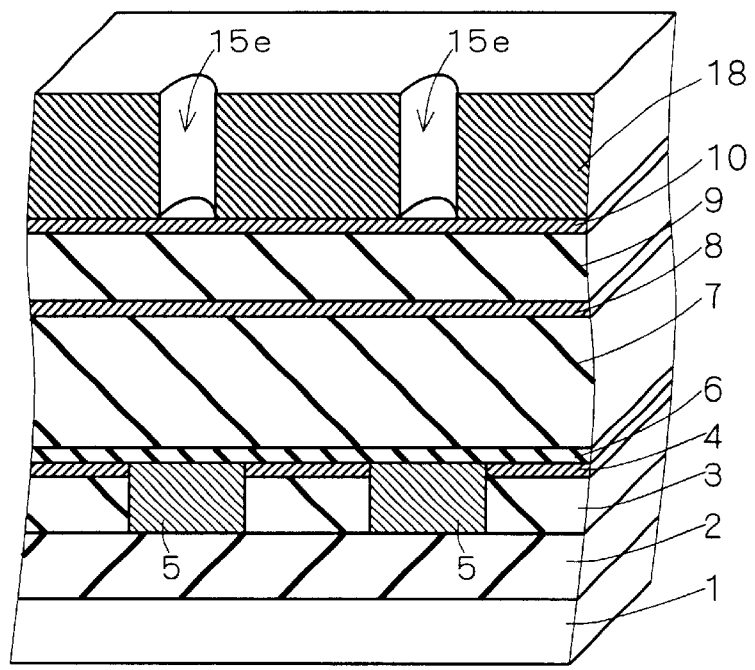
Figure 15:
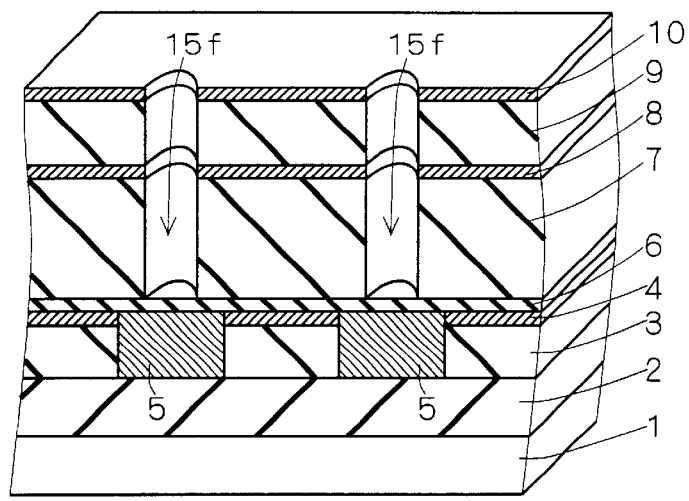
Figure 16:
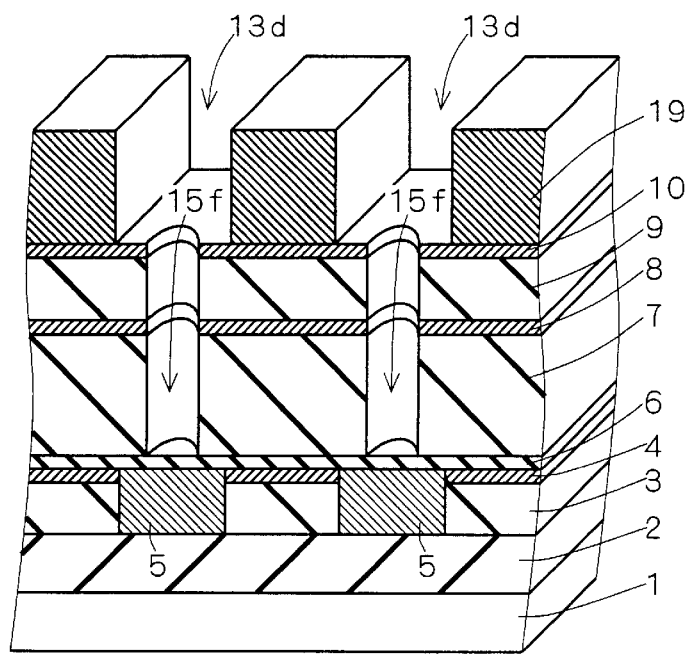

Next, the third low dielectric constant interlayer insulating film 9 is subjected to the etching by using the fourth interlayer insulating film 11 as a mask and the second interlayer insulating film 8 as an etching stopper, and a pattern 13c having the same shape as that of the pattern 13b is formed in a portion of the third low dielectric constant interlayer insulating film 9 which is exposed to the pattern 13b of the wiring trench. At the same time that the pattern 13c is formed, the second low dielectric constant interlayer insulating film 7 is subjected to the etching by using the second interlayer insulating film 8 as a mask and the first interlayer insulating film 6 as an etching stopper, and a pattern 15d having the same shape as that of the pattern 15c is formed in a portion of the second low dielectric constant interlayer insulating film 7 which is exposed to the pattern 15c of the connecting hole (FIG. 6).

Also in this case, if the silicon oxide film is employed as the second and third interlayer insulating films 8 and 10, the silicon nitride film is employed as the first and fourth interlayer insulating films 6 and 11 and the PAE film is employed as the second and third low dielectric constant interlayer insulating films 7 and 9, it is preferable that the plasma etching should be carried out by using the mixed gas of $O_2$ and $N_2$ or the mixed gas of $N_2$ and $H_2$, for example, in the same manner as the formation of the pattern 15b. Consequently, the pattern 13c of the wiring trench can be formed on the third low dielectric constant interlayer insulating film 9 and the pattern 15d of the connecting hole can be formed on the second low dielectric constant interlayer insulating film 7 without etching the first to fourth interlayer insulating films 6, 8, 10 and 11. Moreover, if the mixed gas of $N_2$ and $H_2$ is used, the $NH_3$ gas may further be added.

Figure 21:
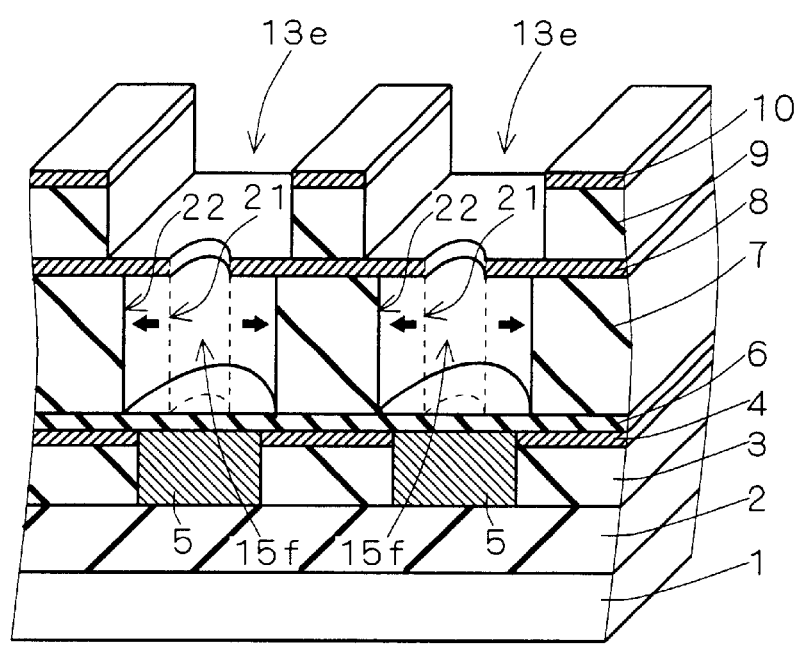

By properly selecting the materials of the second and third low dielectric constant interlayer insulating films 7 and 9 respectively and adjusting the etching rates and the thicknesses of the films, the pattern 13c of the wiring trench and the pattern 15d of the connecting hole can be formed at the same time. If the pattern 13c of the wiring trench and the pattern 15d of the connecting hole are formed at the same time, it is possible to prevent the pattern 15d of the connecting hole from being excessively etched by adjusting the materials, thicknesses and etching rates of the second and third low dielectric constant interlayer insulating films 7 and 9. In other words, the abnormal shape of the connecting hole shown in FIG. 21 is generated with difficulty. In FIG. 21, the wiring trench is provided after the formation of the connecting hole. Therefore, the formed connecting hole is subjected to the excessive etching. However, if the connecting hole and the wiring trench are formed at the same time, the excessive etching for one of them is carried out with difficulty. Accordingly, the pattern 15d of the connecting hole has an abnormal shape with difficulty.

When a sufficient space is formed between the wiring trenches and there is no possibility that adjacent wiring trenches might be short-circuited even if the width of the wiring trench is increased, the pattern 13c of the wiring trench of the third low dielectric constant interlayer insulating film 9 may be formed previously and the second low dielectric constant interlayer insulating film 7 may be subjected to the etching by using the second interlayer insulating film 8 as a mask so that the pattern 15d of the connecting hole is formed. In this case, the second low dielectric constant interlayer insulating film 7 may be etched through the pattern 15c during the formation of the pattern 13c. The reason is that the pattern 15d of the connecting hole is subsequently formed.

Moreover, although the first interlayer insulating film 6 functions as an etching stopper for the etching of the second low dielectric constant interlayer insulating film 7, this film is not essential.

Figure 17:
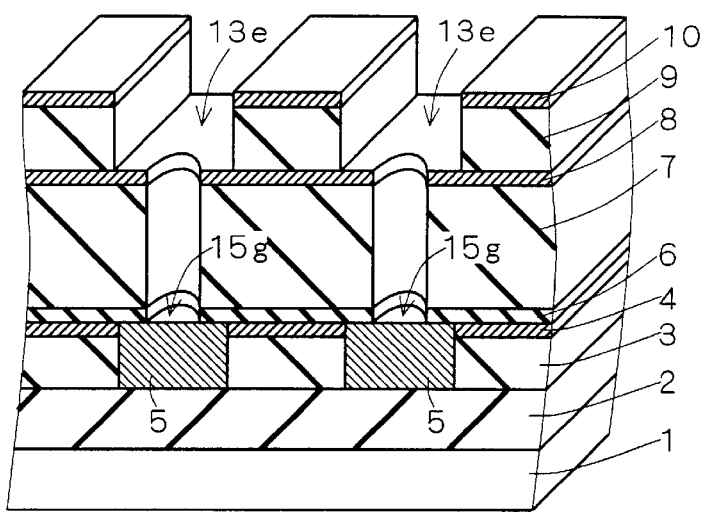

A pattern having the same shape as that of the pattern 15d is formed in a portion of the first interlayer insulating film 6 which is exposed to the pattern 15d of the connecting hole, and the fourth interlayer insulating film 11 is removed. Consequently, a state shown in FIG. 17 is obtained.

In this case, if the silicon oxide film is employed as the second and third interlayer insulating films 8 and 10, the PAE film is employed as the second and third low dielectric constant interlayer insulating films 7 and 9 and the silicon nitride film is employed as the first and fourth interlayer insulating films 6 and 11, it is preferable that plasma etching using a mixed gas of $Cl_2$ and a very small amount of $O_2$ should be carried out, for example. Consequently, the second and third interlayer insulating films 8 and 10 are rarely etched and the portion of the first interlayer insulating film 6 which is exposed to the pattern 15d of the connecting hole and the fourth interlayer insulating film 11 can be removed. Moreover, the second and third low dielectric constant interlayer insulating films 7 and 9 are not etched. The reason is that the PAE film is rarely removed through the plasma etching using the mixed gas of $Cl_2$ and a very small amount of $O_2$. The $O_2$ gas is used in a very small amount. Therefore, also in the case in which a material to be easily etched by the $O_2$ gas plasma, for example, the PAE film is employed as the third low dielectric constant interlayer insulating film 9, the third low dielectric constant interlayer insulating film 9 is less damaged.

As described above, if materials having no etching selectivity each other (the same material such as the silicon nitride film in the above-mentioned example) are employed as the fourth interlayer insulating film 11 and the first interlayer insulating film 6, the fourth interlayer insulating film 11 can be removed and the pattern 15g can be formed at the same time through one—time etching. Consequently, a short time is required from the step of FIG. 6 to that of FIG. 17.

Figure 18:
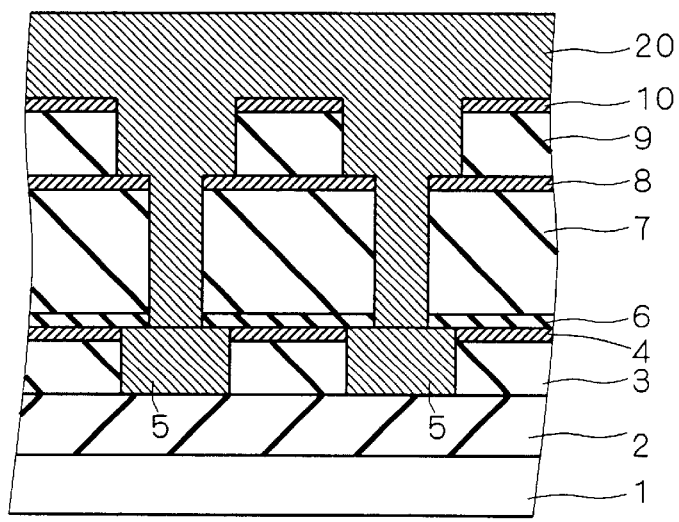
Figure 19:
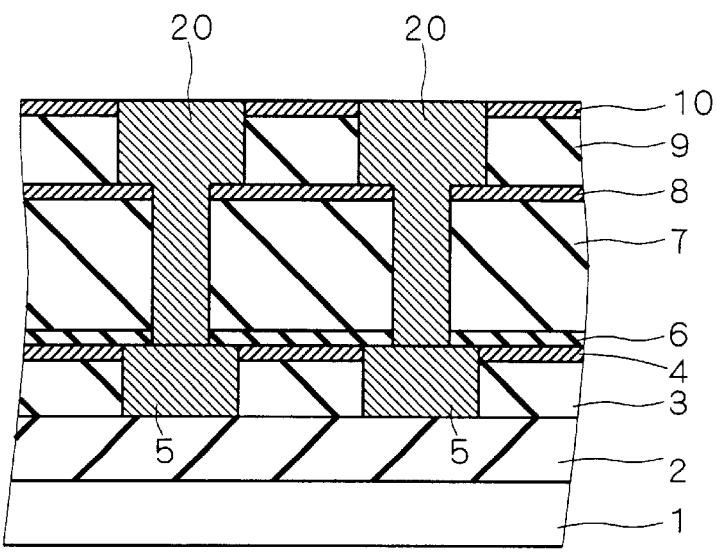
Figure 20:
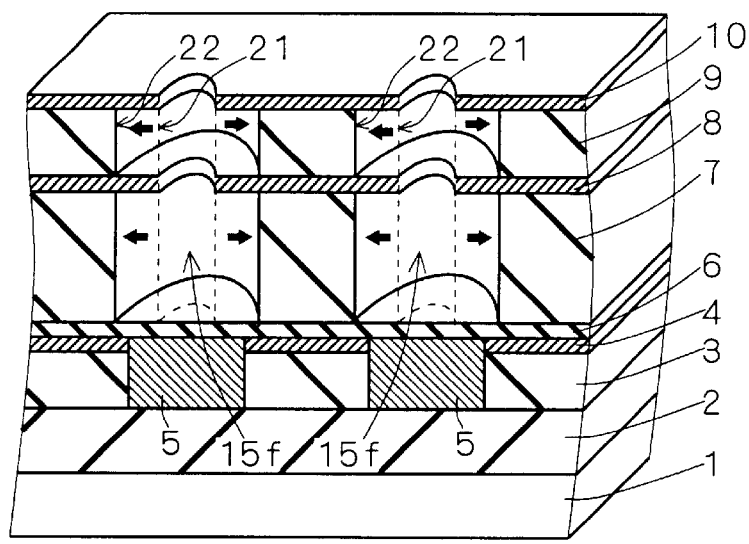
FIGS. 20 and 21 are sectional views showing the drawbacks of the conventional method of manufacturing a contact structure.

Then, a barrier metal (not shown) is formed by using a sputtering method, for example, and a second metal film 20 such as copper is formed on the barrier metal by a reflow method, a CVD method, en electrolytic plating method or the like as shown in FIG. 18 in the same manner as in the conventional art. Then, the barrier metal and the second metal film 20 which are provided above a surface of the third interlayer insulating film 10 are removed by using the CMP method, for example. Thus, a structure shown in FIG. 19 is completed.

FIGS. 2 to 6 are single view drawings for easily distinguishing the connecting hole from the wiring trench.

By using the method of manufacturing a contact structure according to the present embodiment, it is possible to form the contact structure in which the pattern 13c of the wiring trench is provided in the upper side and the pattern 15d of the connecting hole which is narrower than the wiring trench is provided in the lower side. Moreover, even if the photoresist removing processing is carried out for re-patterning during the formation of the pattern 15a, the second and third low dielectric constant interlayer insulating films 7 and 9 are not affected because of the existence of the third and fourth interlayer insulating films 10 and 11 having a high tolerance to the photoresist removing processing. The reason is as follows. When the photoresist 12 is to be formed again, the fourth interlayer insulating film 11 is in the unetching state. Therefore, the low dielectric constant interlayer insulating films 9, 7 and 3 are not exposed to the surface and are not exposed to the $O_2$ gas plasma. Moreover, when the photoresist 14 is to be formed again, the third interlayer insulating film 10 is also in the unetching state. Therefore, the low dielectric constant insulating films 9, 7 and 3 are not exposed to the surface and are not exposed to the $O_2$ gas plasma.

As described above, if the pattern 13c of the wiring trench and the pattern 15d of the connecting hole are formed at the same time, it is possible to prevent the pattern 15d of the connecting hole from being excessively etched by adjusting the materials, thicknesses and etching rates of the second and third low dielectric constant interlayer insulating films 7 and 9. Accordingly, the abnormal shape of the connecting hole shown in FIG. 21 is generated with difficulty.

Furthermore, it is possible to suppress the acceleration of the etching on the low dielectric constant interlayer insulating film. In the stage from FIG. 5 to FIG. 6, the fourth interlayer insulating film 11 takes most of a part of a mask for the etching plasma. Therefore, if a material which rarely has oxygen atoms, for example, a silicon nitride film is employed as the fourth interlayer insulating film 11, it is possible to prevent the etching plasma from being brought into an oxygen rich state.

Accordingly, by using the method of manufacturing a contact structure according to the present embodiment, it is hard to make such troubles that a metal film cannot fully be buried in the connecting hole and the adjacent connecting holes are short-circuited.

Even if a material having a higher dielectric constant than other interlayer insulating films is used for the fourth interlayer insulating film (for example, the above-mentioned silicon nitride film has a dielectric constant of 7.3 which is slightly higher than a dielectric constant of the silicon oxide film to be a typical interlayer insulating film, that is, 3.9), it is finally removed. Therefore, disadvantages are not caused by the addition of the interlayer insulating film.

While the silicon nitride film has been taken as an example of the first and fourth interlayer insulating films in the present embodiment, a silicon carbide film or a silicon carbide oxide film may be used in place of the silicon nitride film.

In the same manner as the silicon nitride film, the silicon carbide film and the silicon carbide oxide film can be selectively etched to the silicon oxide film through the plasma etching using a mixed gas of $Cl_2$ and $O_2$. By changing the flow ratio of the etching gas, an etching selection ratio with the silicon oxide film can be adjusted. Similarly, the etching selection ratio can be adjusted such that the silicon carbide film and the silicon carbide oxide film are not etched but the silicon oxide film is etched in the plasma etching using the mixed gas of $C_4F_8$ and Ar.

Moreover, any film can suppress the acceleration of the etching into the low dielectric constant interlayer insulating film. The silicon carbide oxide film has the oxygen atom therein. Therefore, there might be a fear that the etching plasma is brought into the oxygen rich state to accelerate the etching of the low dielectric constant interlayer insulating film. However, a carbon atom is bonded to the oxygen atom in the silicon carbide oxide film. Consequently, the oxygen atom is less turned out toward the plasma than the silicon oxide film. Moreover, the oxygen atom thus turned out is also bonded to the carbon atom turned out simultaneously so that CO or $CO_2$ is easily generated. Therefore, the etching plasma is not brought into the oxygen rich state.

The silicon carbide film and the silicon carbide oxide film can be formed by the plasma CVD method using, as a material gas, methylsilane ($SiH_n(CH_3)_{4-n}$) or a mixed gas of the methylsilane and $O_2$.

While the invention has been described in detail, the foregoing description is in all aspects illustrative and not restrictive. It is understood that numerous other modifications and variations can be devised without departing from the scope of the invention.

What is claimed is:

1. A method of manufacturing a contact structure comprising the steps of:
    (a) preparing a substrate layer having an electrode to be connected in a surface;

(b) forming a first insulating film, a second insulating film, a third insulating film, a fourth insulating film having a higher tolerance to a photoresist removing processing than said third insulating film, and a fifth insulating film having a first through hole on said substrate layer in this order;

(c) forming said photoresist on said fourth and fifth insulating films, patterning said photoresist, etching said fourth insulating film by using said photoresist as a mask, thereby forming, in said fourth insulating film, a second through hole partially exposed to said first through hole;

(d) etching said third insulating film by using said fourth insulating film as a mask, thereby forming, in said third insulating film, a third through hole having the same shape as that of said second through hole;

(e) etching said fourth insulating film by using said fifth insulating film as a mask, thereby forming a fourth through hole having the same shape as that of said first through hole;

(f) etching said second insulating film by using said third insulating film as a mask, thereby forming a fifth through hole having the same shape as that of said second through hole; and (g) etching said third insulating film and said first insulating film by using said fourth insulating film and said second insulating film as masks, thereby forming sixth and seventh through holes having the same shapes as those of said first through hole and said second through hole to be positioned above said electrode, respectively.

2. The method of manufacturing a contact structure according to claim 1, wherein said sixth through hole and said seventh through hole are simultaneously formed at said step (g).

3. The method of manufacturing a contact structure according to claim 1, wherein said steps (e) and (f) are carried out at the same time.

4. The method of manufacturing a contact structure according to claim 1, further comprising the step (h) of removing said fifth insulating film after said step (g).

5. The method of manufacturing a contact structure according to claim 1, further comprising the step (i) of forming a sixth insulating film having etching selectivity to said first insulating film on said substrate layer before said step (b); and the step (j) of etching said sixth insulating film by using said first insulating film as a mask, thereby forming an eighth through hole having the same shape as that of said second through hole.

6. The method of manufacturing a contact structure according to claim 5, further comprising the step (k) of removing said fifth insulating film after said step (g), said step (k) and said step (j) being carried out at the same time.

7. The method of manufacturing a contact structure according to claim 6, wherein said fifth and sixth insulating films are silicon nitride films, silicon carbide films or silicon carbide oxide films, said second and fourth insulating films are silicon oxide films, said first or third insulating film is a polyarylether film, and said eighth through hole is formed and said fifth insulating film is removed through plasma etching using a mixed gas of chlorine and a very small amount of oxygen at said steps (j) and (k).

8. The method of manufacturing a contact structure according to claim 1, wherein said fifth insulating film is a silicon nitride film, a silicon carbide film or a silicon carbide oxide film.

9. The method of manufacturing a contact structure according to claim 8, wherein said second and fourth insulating films are silicon oxide films.

10. The method of manufacturing a contact structure according to claim 9, wherein said first through hole is formed in said fifth insulating film through plasma etching using a mixed gas of chlorine and oxygen.

11. The method of manufacturing a contact structure according to claim 9, wherein said first or third insulating film is a polyarylether film, and said second, fourth or fifth through hole is formed by plasma etching using a mixed gas of carbon fluoride and argon at said step (c), (e) or (f).

12. The method of manufacturing a contact structure according to claim 9, wherein said first or third insulating film is a polyarylether film, and said second, fourth or fifth through hole is formed by plasma etching using a mixed gas of carbon fluoride, argon and a very small amount of oxygen at said step (c), (e) or (f).

13. The method of manufacturing a contact structure according to claim 1, wherein said first or third insulating film is a polyarylether film, and said third, sixth or seventh through hole is formed by plasma etching using a mixed gas of nitrogen, hydrogen and ammonia at said step (d) or (g).

14. The method of manufacturing a contact structure according to claim 1, wherein said first or third insulating film is a polyarylether film, and said third, sixth or seventh through hole is formed by plasma etching using a mixed gas of nitrogen and hydrogen at said step (d) or (g).

15. The method of manufacturing a contact structure according to claim 1, wherein said first or third insulating film is a polyarylether film, and said third, sixth or seventh through hole is formed by plasma etching using a mixed gas of nitrogen and oxygen at said step (d) or (g).

* * * * *